(12) United States Patent
Samuels et al.

(10) Patent No.: US 6,268,907 B1
(45) Date of Patent: *Jul. 31, 2001

(54) ELIMINATION OF STANDING WAVES IN PHOTORESIST

(75) Inventors: Donald J. Samuels, Yorktown Heights; Alan C. Thomas, Hughsonville, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/078,288

(22) Filed: May 13, 1998

(51) Int. Cl.$^7$ .................................................. G03B 27/54
(52) U.S. Cl. .............................. 355/71; 355/53; 355/67
(58) Field of Search ................................ 355/53, 67, 71, 355/45; 359/599, 737, 894, 209

(56) References Cited

U.S. PATENT DOCUMENTS

| | | |
|---|---|---|
| 4,377,339 | 3/1983 | Coppock . |
| 4,970,546 * | 11/1990 | Suzuki et al. ........................... 355/53 |
| 5,323,207 * | 6/1994 | Kawasaki ............................... 355/53 |
| 5,424,803 * | 6/1995 | Noguchi ................................. 355/53 |
| 5,539,567 | 7/1996 | Lin et al. . |
| 5,539,568 | 7/1996 | Lin et al. . |
| 5,580,701 | 12/1996 | Lur et al. . |
| 5,712,698 * | 1/1998 | Poschenrieder et al. .............. 355/71 |
| 5,717,483 * | 2/1998 | Kikuchi ................................. 355/69 |

FOREIGN PATENT DOCUMENTS

| | | |
|---|---|---|
| 3-11686 | 1/1991 | (JP) . |
| 5-121285 | 5/1993 | (JP) . |
| 5-234851 | 9/1993 | (JP) . |
| 6-216068 | 8/1994 | (JP) . |
| 7-169676 | 7/1995 | (JP) . |
| 8-45901 | 2/1996 | (JP) . |
| 9-45607 | 2/1997 | (JP) . |

* cited by examiner

Primary Examiner—Alan A. Mathews
(74) Attorney, Agent, or Firm—Scully, Scott, Murphy & Presser; Daryl K. Neff, Esq.

(57) ABSTRACT

The present invention provides a method and an optical lithographic system which eliminates the standing wave effect typically observed in photoresists without the need for altering the thickness of the photoresist, utilizing an antireflective coating material, or changing the light source. Specifically, the present invention compensates for standing waves by exposing the photoresist with light from a light source at different phases. That is, in the present invention there is a change in light exposure from a single dose at one phase to a plurality of doses at different phases; therefore dispersing the effects of the standing wave at each of those phases which in turn eliminates the standing wave.

18 Claims, 3 Drawing Sheets

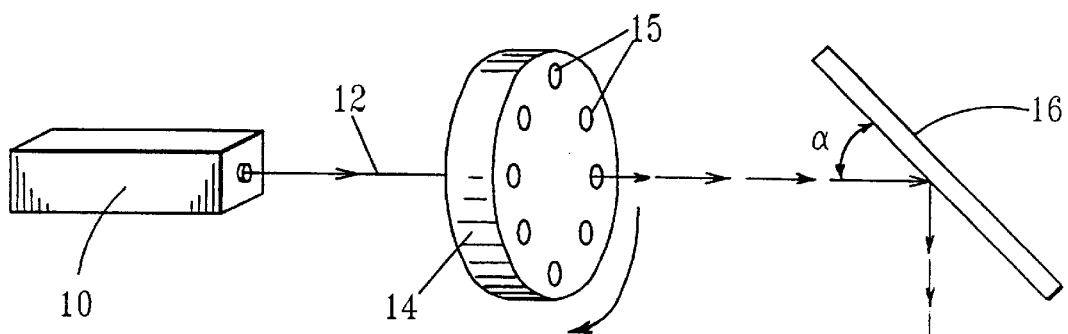
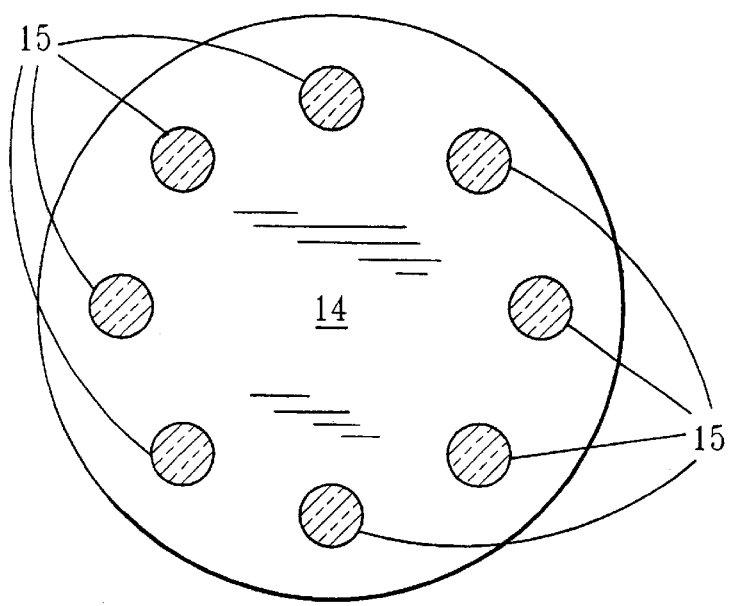
FIG. 1
FIG. 2

ELIMINATION OF STANDING WAVES IN PHOTORESIST

DESCRIPTION

1. Field of the Invention

The present invention relates to lithography and, in particular to a method for eliminating standard waves in a photoresist layer used for patterning another layer in semiconductor device manufacturing without changing the exposure source or photoresist material. The present invention also provides an optical lithographic system which is capable of overcoming the problem of standing waves in photoresists.

2. Background of the Invention

With the relentless advance in photolithography to smaller and smaller dimensions at a faster rate than the reduction of the exposing wavelength, new problems in imaging are arising that now need to be addressed. One of the problems in this area which has made itself known in recent years is the issue of standing waves in photoresists.

Standing waves in a developed photoresist image arise from the interference between the incoming light, and light reflected off of the bottom of the photoresisc film (reflected light). When this occurs, the light intensity in the photoresist consists of a series of constructive/destructive interference patterns oriented vertically in the photoresist profile. Upon exposure to light, a chemical reaction occurs in the photoresist such that when the photoresist is placed into a developer solution, the photoresist is either removed in areas wherein exposure occurs (positive tone resist) or the unexposed areas are removed (negative tone resist). The boundary between resist removal and resist remaining is typically set by a threshold dose of light.

If there were no standing waves, this threshold would propagate more or less vertically into the photoresist. With the addition of standing waves, however, the constant intensity profile appears as a sinusoidal curve propagating into the photoresist. The standing wave occurs because of reflection of the light off the bottom of the photoresist (or even films beneath the photoresist) sending light back towards the lens of the optical system creating a constructive, destructive interference pattern much like an interferometer. The standing wave effect of the phozoresist typically results in necking and/or bridging of adjacent pattern lines in the underlying layers of the structure being patterned.

In older semiconductor manufacturing technologies, standing waves were not a serious problem due to a number of factors which include: A broad-band illumination light source for exposure. The Micrascan II light source, for example, utilizes a mercury source with an exposing wavelength of from about 245 nm to about 255 nm as well as high diffusivity photoresists. In addition, after exposure, but before development, a post-exposure bake (PEB) step is typically employed. This PEB step among other things serves to diffuse the molecules of the photoresist smearing out standing waves in the photoresist.

The amount that the photoresist molecules are diffused is characterized by the diffusion length. As the requirements on what a lithography system is called on to do get progressively more tighter and stringent, the smearing due to the diffusion of the photoresist molecules can no longer be tolerated and so the diffusion length must be reduced. This in turn will bring back the standing waves which were smeared out by the diffusion.

The reduction in wavelength bandwidth is necessitated by the need to reduce chromatic aberrations in the lens. The stepper manufacture thus must strive to make the optical lithographic system as perfect as possible. If the wavelength remained broad, then, in the photoresist, there would exist an infinite number of separate standing waves, each with a wavelength equal to the wavelength of the exposing light divided by the index of refraction of the resist.

In the prior art, it is known to eliminate the standing waves by reducing the thickness of the photoresist by employing a PEB step or multiple exposure steps. Another technique currently employed in the prior art to eliminate standing waves is to utilize an anti-reflecting coating (ARC) material which is typically placed between the photoresist and the semiconductor structure that is be patterned. ARC is also used in the prior art to improve dimensional control. If the underlying films vary in thickness across the semiconductor wafer, then the amount of light reflecting off of these films will vary as well. This in turn will mean that the area being exposed will get a dose variation which leads to a variation in image size.

Elimination of the standing wave effect in photoresists by changing the thickness of the photoresist is disclosed, for example, in Japanese Patent Nos. 6-216068 (JP. '068) and 7-169676 (JP. '676). Specifically, JP. '068 eliminates standing waves by reducing the thickness of the photoresist by first exposing the photoresist to a first light source. Next, the exposed photoresist is thermally treated to reduce the thickness of the photoresist to a prescribed value. Thereafter, a second light exposure process is carried out. At this point of the process, the nodes and antinodes of light standing waves generated at the first and second light exposure process deviate from each other in position; therefore, the standing wave is canceled out.

In JP. '676, there is disclosed an exposure method whereby the thickness of the photoresist changes after each exposure step. When the exposure frequency and time between exposures is made optimum, the standing wave effect can be eliminated.

The use of ARC materials for eliminating standing waves i-n photoresists are disclosed, for example, in U.S. Pat. Nos. 4,377,339 and 5,580,701 as well as Japanese Patent Nos. 5-121285 and 8-45901.

Although each of the above processes are capable of eliminating the standing wave effect in photo-resists, they cause significant reduction in the processing window and thus this makes each of the prior art processes unsuitable for patterning smaller dimension semiconductor devices.

Additionally, extra processing steps as well as materials, e.g. ARC materials, are needed in the prior art to eliminate the standing wave effect in the photoresist which adds additional cost and time in manufacturing the semiconductor devices.

In view of the drawbacks mentioned with prior art processes for eliminating standing waves in photoresists, there is a continued need to develop a new method and optical lithographic system which by itself is capable of eliminating the standing wave effect observed with today's current semiconductor manufacturing technologies.

SUBJECT OF THE INVENTION

One object of the present invention is to provide a method for eliminating standing waves in a photoresist which does not alter the overall thickness of the photoresist material or add additional processing steps to the overall patterning process.

Another object of the present invention is to provide a method of eliminating the standing waves in photoresists that does not require the use of an anti-reflective coating material, a special photoresist material or a change in the exposure source.

A further object of the present invention is to provide a method of eliminating the standing wave effect in photoresists whereby a phase shift in time, not space domain, is employed.

A still further object of the present invention is to provide a method of eliminating standing waves in photoresists such that no substantial loss in the processing window occurs.

These and other objects and advantages can be achieved in the present invention by changing the exposure light from a single dose at one phase, i.e. just one optical path length directed from the light source to the photoresist, to a plurality of doses at different phases so as to spread out the effects of the standing wave at each of those phases. The different phases are generated in the present invention by varying the optical path length through which the exposing light travels from the light source to the photoresist.

Specifically, the method of the present invention comprises the steps of:

(a) providing an optical lithographic system, wherein said optical lithographic system comprises a light source, a rotating disk and a lens arranged in series along an optical axis, wherein said rotating disk contains a plurality of apertures, each aperture comprising a transparent medium having parallel entry and exit surfaces, a refractive index different from that of the optical axis and different thicknesses;

(b) positioning a photomask transversely of said optical axis between said rotating disk and said lens, wherein said photomask contains an image adapted to be optically projected by said light source;

(c) positioning a semiconductor wafer transversely after said lens, wherein said semiconductor wafer includes a photoresist; and (d) exposing said semiconductor wafer to light so as to transfer the image from said photomask to said semiconductor wafer.

In another embodiment of the present invention, the refractive index of each aperture is varied so as to change the optical path length through which the exposing light source travels.

In yet another embodiment of the present invention, an optical switch, e.g. a rotating mirror, is used in place of the rotating disk to direct light into paths of different lengths which eventually converge back into the same optical axis prior to reaching the photomask.

In still another embodiment of the present invention, the optical system does not include either a rotating disk or an optical switch. Instead, the path length is varied by positioning the light source on a moveable object which travels parallel to the optical axis. By varying the speed of the moveable object, one can control the phase of the light along the optical axis.

In another aspect of the present invention, an optical lithographic system is provided which compensates for standing waves by exposing the photoresist with light at different phases. In order to achieve this, controlled amounts of light for each exposure are delivered through paths of different effective optical path lengths. Specially, the optical lithographic system of the present invention comprises:

(a) a light source, a rotating disk and a lens arranged in series along an optical axis, wherein said rotating disk contains a plurality of apertures, each aperture comprising a transparent medium having parallel entry and exit surfaces, a refractive index different from that of the optical axis and different thicknesses;

(b) a photomask disposed transversely of said optical axis between said light source and said lens, wherein said photomask contains an image adapted to be optically projected by said light source; and (c) a semiconductor wafer disposed transversely after said lens so as to receive said optically projected image.

In other embodiments of the present invention, the optical lithographic system includes a rotating disk having a plurality of apertures wherein the refractive index of the transparent media is varied or a rotating mirror which is used in place of the rotating disk.

In yet another embodiment of the present invention, the optical lithographic system comprises:

(a) a light source and a lens arranged in series along an optical axis, wherein said light source is positioned on a moveable object which travels in a parallel path to said optical axis;

(b) a photomask disposed transversely of said optical axis between said light source and said lens, wherein said photomask contains an image adapted to be optically projected by said light source; and (c) a semiconductor wafer disposed transversely after said lens so as to receive said optically projected image.

BRIEF DESCRIPTION OF THE DRAWINGS

FIG. 1 is a schematic diagram of one of the embodiments of the present invention wherein a rotating disk is inserted into the optical path of an optical lithography system between the light source and the lens system. In this drawing an optional beamsplitter is shown.

FIG. 2 is an enlarged view of the rotating disk employed in the present invention.

DETAILED DESCRIPTION OF THE INVENTION

Figure 3:
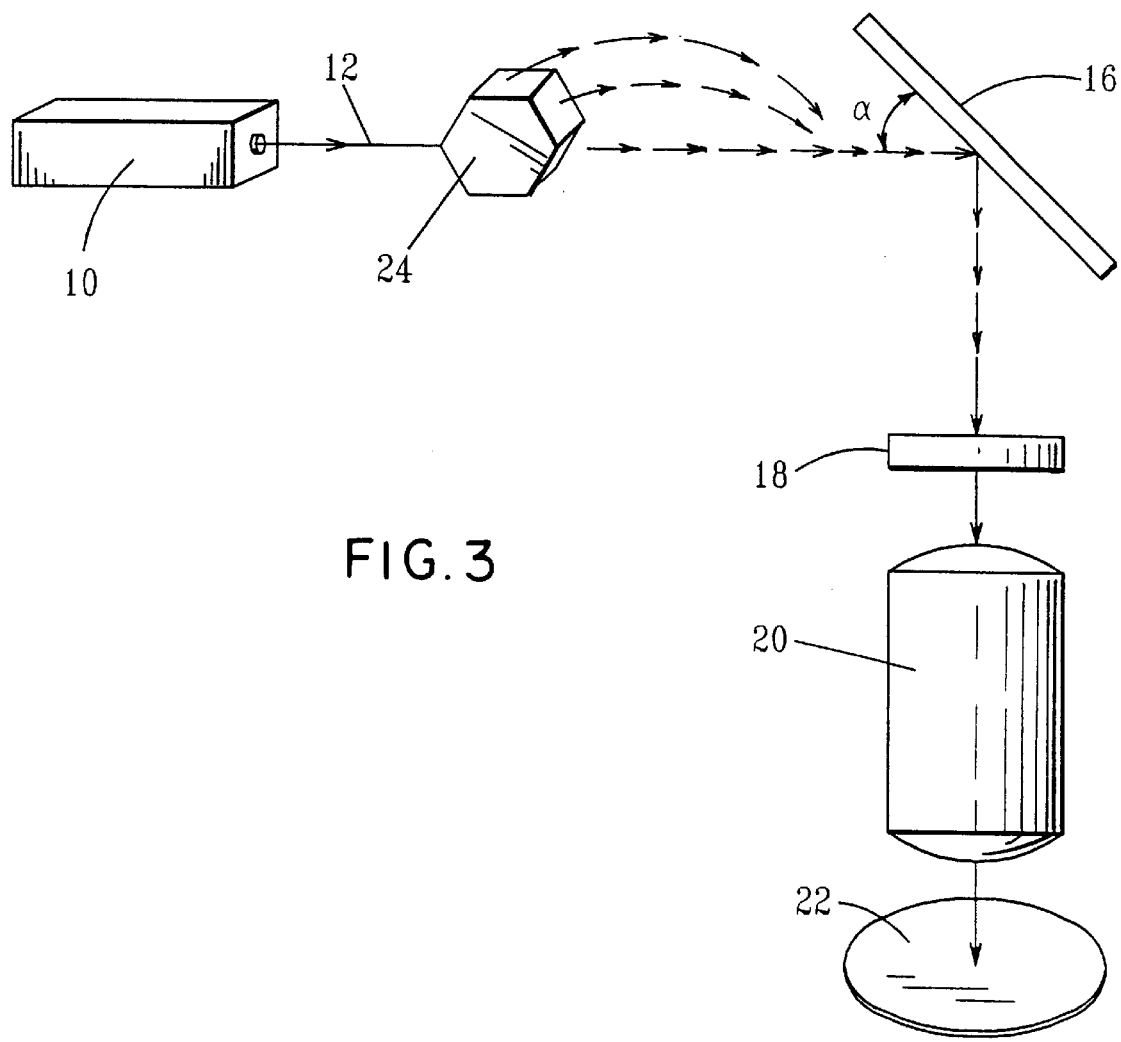
FIG. 3 is a schematic diagram of another embodiment of the present invention wherein a rotating mirror is inserted into the optical path of an optical lithography system between the light source and the lens system. An optional beamsplitter is shown in this drawing.

The present invention will now be described in more detail with reference to the accompanying drawings wherein like reference numerals are used for like and corresponding elements of the drawings. Reference is first made to FIG. 1 which illustrates one of the embodiments of the optical lithographic system of the present invention. Specifically, the optical lithographic system of the present invention shown in FIG. 1 comprises a light source 10 that is capable of emitting light along an optical axis 12. The optical system further includes a rotating disk 14 having a plurality of apertures 15 disposed therein and lens 20 which are aligned along optical axis 12. An optional beamsplitter 16 may be positioned along said optical axis 12 so as to project the light from light source 10 to lens 20. It should be noted that when the optical lithographic system does not contain the beamsplitter, the optical axis is along a straight line. When optional beamsplitter 16 is employed, it is positioned between rotating disk 14 and lens 20 at an angle α to optical axis 12. A photomask 18 is disposed transversely of optical axis 12 between optional beamsplitter 16 and said lens 20. A semiconductor wafer 22 or another substrate which is capable of receiving a pattern or image is positioned after lens 20. It is noted that the semiconductor wafer typically contains a photoresist on its surface. For clarity, the photoresist is not shown in the drawings of the present invention.

In accordance with the present invention, light source 10 is any source that is capable of projecting light energy for use in lithography. Suitable light sources include, but are not limited to: a mercury lamp or a laser. When a mercury light source is employed, it is generally capable of emitting a continuous beam of light having variable discrete wavelengths. The specific spectral line(s) to be used would be chosen by use of a filter. For example, the wavelength for G-line is about 436 nm, the wavelength of H-line is about 404 to 408 nm, and the wavelength for I-line is about 365 nm. In additional to these, the light source employed in the present invention may operate in the deep UV region (245–255 nm). The mercury lamps put out all the spectral lines discussed above. Filters can be used with the mercury lamps to select which spectral lines will be employed in the lithographic process.

When a laser is employed, the laser source emits continuous or pulsed light. Current technology has pulsed lasers at 248 nm (KrF), 193 nm (ArF) and about 150 nm (F$_2$). The wavelength used in the process will be dictated by the minimum resolution needs of that particular process. The present invention works equally well with any of these lasers, or any other lasers that may be invented in the future.

Optional beamsplitter 16 which may be employed in the present invention is any beamsplitter that is capable of reflecting a portion of the incident light from optical axis 12 to lens 20. Optional beamsplitter 16 thus may comprise a partially transmissive-partially reflective plane mirror or any other type of mirror which can Function accordingly.

Lens 20 is composed of any lens that is capable of projecting the light passing through photoresist 18 to semiconductor wafer 22. Such lens are well known to those skilled in the art.

Any of the commonly employed photomasks that are currently employed in lithography can be employed in the present invention. Thus, the present invention is not limited to any type of photomask.

This is also applicable to the photoresist which is positioned on top of semiconductor wafer 22 (For clarity, the photoresist is not shown in the drawings of the present invention). Hence any of the commonly employed photoresists employed in lithography including positive tone resists and negative tone resists may be employed. Additionally, it is emphasized that the thickness of the originally photoresist is not substantially altered by employing the optical lithography system of the present invention. Instead, the exposure process does not reduce the thickness of the initial photoresist to a new thickness which is then used to eliminate the standing wave effect.

The standing wave effect is eliminated in the present invention by utilizing rotating disk 14 shown in FIG. 1. FIG. 2 shows a blown-up drawing of rotating disk 14. As is illustrated in FIG. 2, rotating disk 14 contains a plurality of apertures 15. Each aperture comprises a transparent media such as, but not limited to: glass, quartz, fused silica, calcium fluoride or diamond having parallel entry and exit surfaces which allows for light to travel through.

A key feature of the transparent media is that they be composed of a transparent media that has a refractive index different from that of the optical axis. Moreover, each aperture has a thickness which must be different from its neighboring element such that the light exiting each aperture has a different optical path length. Specifically, each aperture has a thickness that is derived using the following formula:

$$T_{n+1} = T_n + \frac{\lambda}{M}$$

wherein $T_{n+1}$ is the thickness of aperture n+1, $T_n$ is the thickness of aperture n, $\lambda$ is the exposing wavelength, and M is the total number of apertures.

To ensure elimination of the standing wave in the photoresist at least 2 different optical paths length should be provided. More preferably, at least from about 8 to about 16 different optical path lengths should be provided.

In accordance with the present invention wherein a pulsed light source is employed, after each pulse of light energy, the rotating disk rotates out of the current aperture and replaces it with a new aperture having a different thickness from the preceding aperture. By forcing light through these optical apertures, the light at photomask 18 will travel a path whose length will partially be determined by these apertures. In essence, each laser pulse will arrive at semiconductor wafer 22 with a different phase than its predecessor thus eliminating the standing wave in the photoresist that is positioned atop the wafer. Stated in another way, each laser pulse will have its own unique standing wave, the peak will be shifted from the one previous to it, and the next. The net effect will be to smear out the standing wave in the photoresist without altering the photoresist or changing the light source. When a continuous light source is employed, the rotating disk breaks the continuous light beam into discrete pulses creating the same affect as described hereinabove.

Another way that the light from the light source can be disposed into different phases in the present invention is to vary the index of refraction between each of the transparent media. Specifically, the transparent medium may have an index of refraction which is derived from the following formula:

$$W_n = \frac{TN_n}{\lambda}$$

wherein T is the thickness of the aperture, $\lambda$ is the exposing wavelength, $N_n$ is the index of refraction of the $n^{th}$ aperture, and $W_n$ is the number of waves in that aperture.

Thus, for the number of waves of the n+1 aperture, the equation would be $$W_{n+1} = W_n + \frac{1}{M}$$

which can be rewritten as:

$$\frac{TN_{n+1}}{\lambda} = \frac{TN_n}{\lambda} + \frac{1}{M}$$

solving for $N_{n+1}$ gives $$N_{n+1} = N_n + \frac{\lambda}{TM}$$

wherein $N_{n+1}$, $N_n$, $\lambda$, T, and M are as defined above.

The net effect of this embodiment is the same as the previous one, i.e. it eliminates the standing wave in the photoresist by shifting each laser pulse arriving at the semiconductor wafer to a different phase through paths of different effective optical path lengths.

In still yet another embodiment of the present invention, the rotating disk is replaced with a rotating mirror. This embodiment of the present invention is shown in FIG. 3. Specifically, the optical lithographic system shown in FIG. 3 contains the same elements as shown in FIG. 1 except that rotating disk 14 is replaced with an optical switch, e.g. rotating mirror 24, that is capable of guiding the light heading towards optional beamsplitter 16 down paths of different wavelengths converging on optional beamsplitter 16. When the optional beamsplitter is not present, the light converges before it comes in contact with photomask 18. The optical lithographic system of FIG. 3 eliminates the standing wave effect in the same manner as described hereinabove, i.e. it changes the one optical path length direct from the light source to the photoresist to multiple paths having different path lengths which serve to spread out the standing wave effect.

Any material which is capable of dispersing the light source from one optical path length to multiple path lengths can be employed as the rotating mirror. Such materials are conventional and are thus well known to those skilled in the art. As was the case with the rotating disk, after each successive pulse of light, the rotating mirror is turned to the next face of the mirror.

Figure 4:
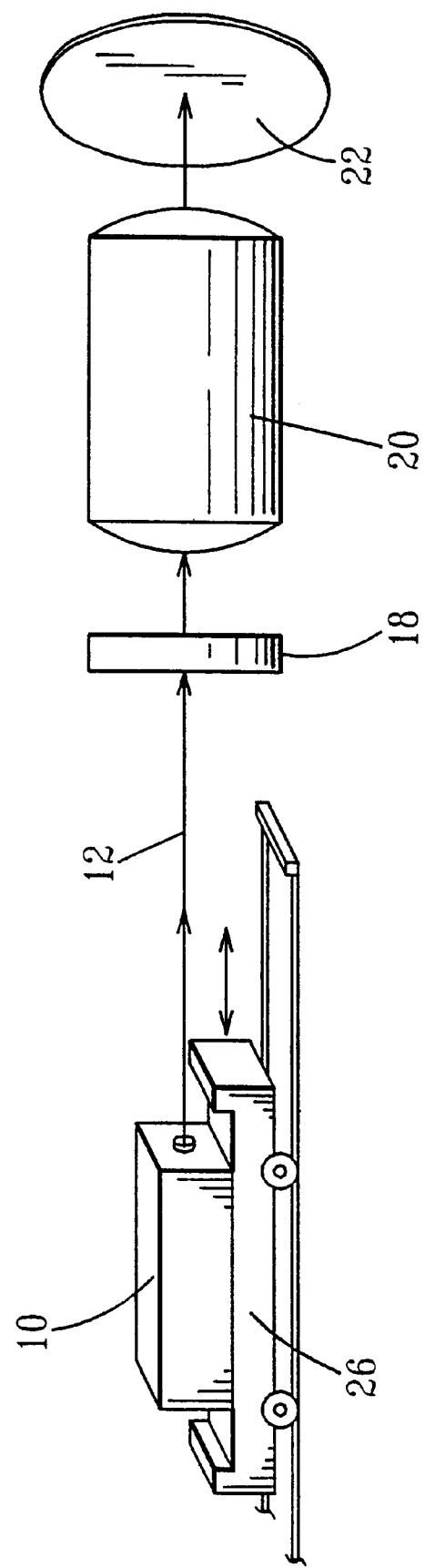
FIG. 4 is a schematic diagram of yet another embodiment of the present invention wherein the light source is positioned on a moveable object which travels parallel to the optical axis. In this drawing, no optional beamsplitter is employed.

In a further embodiment of the present invention, the rotating disk or the rotating mirror are not employed. Instead, the optical path length is changed by positioning the light source on a moveable object. This embodiment of the present invention is shown in FIG. 4. Specifically, FIG. 4 comprises light source 10, optical axis 12, photomask 18, lens 20 and semiconductor wafer 22 arranged in series. In addition to these elements, the optical lithographic system shown in FIG. 4 includes a moveable object 26 on which light source 10 is positioned on.

Suitable moveable objects include: a car, a belt, a conveyor, or like objects which are capable of being moved or which move themselves. When a car is employed, the car is located on a track and is powered to move between a starting position and an end position near photomask 18.

In order to create different path lengths, the movable object can move at different speeds which are sufficient to create a phase change in the light. Thus, fast as well as slow speeds are contemplated in the present invention. The exact speeds cannot be precisely given. This is because each image on the wafer requires a certain dose to be exposed. This translates into a certain number of pulses of the laser; each laser can vary the strength or dose of each pulse. In addition, the time between pulses is variable; therefore, if it takes P pulses to give an image its total prescribed dose, and t is the time from the start of one pulse to the start of the next pulse, the laser would be required to move an integer multiple of λ over P×t. This can be alternatively written as $$V = i\left(\frac{\lambda}{tP}\right)$$

wherein V is the velocity of the laser and i is an arbitrary integer.

While the invention has been particularly shown and described with respect to preferred embodiments thereof, it will be understood by those skilled in the art that the foregoing and other changes in form and detail made be made without departing from the scope and spirit of the present invention. It is therefore intended that the present invention not be limited to the exact forms described and illustrated, but fall within the scope of the appended claims.

having thus described our invention, what we claim as new, and desire to secure Letters Patent is:

1. A method for eliminating the standing wave effect present in a photoresist exposed to light from a light source in a pattern defined by a photomask, wherein the light travels on an optical path from the light source through the photomask to the photoresist, said optical path having a length, and said method comprising the step of varying the length of the optical path traveled by the light incident on the photoresist through a plurality of values, thereby eliminating the standing wave effect, wherein the path length is varied by passing the light through a rotating disk, saidn rotating disk having a plurality of apertures formed therein, each aperture having disposed therein a transparent medium having parallel entry and exit surfaces, and wherein the transparent medium in each aperture provides an optical path length for light passing through the transparent medium which is different from optical path length of the transparent medium in other apertures.

2. The method of claim 1 wherein the transparent media in each of the apertures have different refractive indices.

3. The method of claim 2 wherein the transparent media in each of the apertures have different refractive indices.

4. The method of claim 1 wherein the transparent media in each of the apertures have the same refractive index, but different thicknesses.

5. The method of claim 2 wherein the transparent media in each of the apertures have the same refractive index, but different thicknesses.

6. The method of claim 1 wherein the transparent media comprises quartz, glass or diamond.

7. The method of claim 1 wherein the rotating disk has from 8 to 16 apertures formed therein to create from 8 to 16 different optical path lengths.

8. The method of claim 2 wherein the rotating disk has from 8 to 16 apertures formed therein to create from 8 to 16 different optical path lengths.

9. The method of claim 1 wherein the path length is varied by a rotating mirror that directs the light from the light source into paths of different lengths.

10. The method of claim 1 wherein the light source is a continuous light source.

11. The method of claim 10 wherein said continuous light source is a mercury light source operating at variable wavelengths.

12. An optical lithographic system for producing an image on a photoresist without formation of standing waves, comprising:

(a) a light source;

(b) a photomask;

(c) a lens; and (d) a semiconductor wafer; wherein the light source, the photomask, the lens and the wafer are disposed such that light travels from the light source along an optical path through the photomask and then the lens to reach the wafer, and further comprising:

(e) means disposed on the optical path between the light source and the wafer for varying the length of the optical path of the light incident on the wafer among a plurality of discrete values to fully expose said wafer, wherein at any given time the light arriving at the wafer has traveled on an optical path having only one of the discrete values, wherein the means for varying the length of the optica path comprises a rotatng disk, said rotating disk having plurality of apertures formed therein, each aperture having disposed therein a transparent medium having parallel entry and exit surfaces, and wherein the transparent medium in each aperture provides an optucal path length for light passing through the transparent medium which is different from the optical path length of the transparent medium in other apertures.

13. The system of claim 12 wherein the transparent media in each of the apertures have different refractive indices.

14. The system of claim 12 wherein the transparent media in each of the apertures have the same refractive index, but different thicknesses.

15. The system of claim 12 wherein the rotating disk has from 8 to 16 apertures formed therein to create from 8 to 16 different opticakl path lengths.

16. A method for eliminating the standing wave effect present in a photoresist exposed to light from a light source in a pattern defined by a photomask, wherein the light travels on an optical path from the light source through the photomask to the photoresist, said optical path having a length, and said method comprising the step of varying the length of the optical path traveled by the light incident on the photoresist through more than two different values, thereby eliminating the standing wave effect.

17. A method for eliminating the standing wave effect present in a photoresist exposed to light from a light source in a pattern defined by a photomask, wherein the light travels on an optical path from the light source through the photomask to the photoresist, said optical path having a length, and said method comprising the step of varying the length of the optical path traveled by the light incident on the photoresist through a plurality of values, thereby eliminating the standing wave effect, wherein the path length is varied by passing the light through a rotating mirror that directs the light from the light source into paths of different length.

18. An optical lithographic system for producing an image on a photoresist without formation of standing waves, comprising:
  (a) a light source;
  (b) a photomask;
  (c) a lens; and
  (d) a semiconductor wafer; wherein the light source, the photomask, the lens and the wafer are disposed such that light travels from the light source along an optical path through the photomask and then the lens to reach the wafer, and further comprising:
  (e) means disposed on the optical path between the light source and the wafer for varying the length of the optical path of the light incident on the wafer among a plurality of discrete values to fully expose said wafer, wherein at any given time the light arriving at the wafer has traveled on an optical path having only one of the discrete values, wherein the means for varying the length of the optical path comprises a rotating mirror that directs the light form the light source into paths of different length.

\* \* \* \* \*